(12) United States Patent
Farnsworth et al.

(10) Patent No.: US 8,625,070 B2
(45) Date of Patent: Jan. 7, 2014

(54) LITHOGRAPHIC APPARATUS, PROJECTION SYSTEM AND DAMPER FOR USE IN A LITHOGRAPHIC APPARATUS AND DEVICE MANUFACTURING METHOD

(75) Inventors: Windy Lynn Farnsworth, New Milford, CT (US); Santiago E. Del Puerto, Milton, NY (US); Samir A. Nayfeh, Shrewsbury, MA (US)

(73) Assignee: ASML Holding N.V., Veldhoven (NL)

( * ) Notice: Subject to any disclaimer, the term of this patent is extended or adjusted under 35 U.S.C. 154(b) by 1153 days.

(21) Appl. No.: 12/258,689

(22) Filed: Oct. 27, 2008

(65) Prior Publication Data
US 2009/0180091 A1 Jul. 16, 2009

Related U.S. Application Data

(60) Provisional application No. 60/988,341, filed on Nov. 15, 2007.

(51) Int. Cl.
G03B 27/42 (2006.01)
G03B 27/54 (2006.01)

(52) U.S. Cl.
USPC ............................................. 355/53; 355/67

(58) Field of Classification Search
USPC ...................... 355/67, 53; 359/819
See application file for complete search history.

(56) References Cited

U.S. PATENT DOCUMENTS

| 5,606,380 | A | * | 2/1997 | Tatamiya | 396/358 |
| 7,145,270 | B2 | | 12/2006 | Mizuno | |
| 7,230,676 | B1 | | 6/2007 | Loopstra et al. | |
| 2007/0024829 | A1 | * | 2/2007 | Mizuno | 355/18 |
| 2008/0278828 | A1 | | 11/2008 | Rau et al. | |
| 2008/0285161 | A1 | | 11/2008 | Geuppert et al. | |
| 2009/0051889 | A1 | | 2/2009 | Ishikawa | |

FOREIGN PATENT DOCUMENTS

| EP | 1 835 348 A2 | 9/2007 |
| JP | 02-245531 A | 10/1990 |
| JP | 2002-245531 A | 8/2002 |
| JP | 2004-340372 A | 12/2004 |
| WO | WO 94/13975 A1 | 6/1994 |
| WO | WO 2006/084657 A1 | 8/2006 |
| WO | WO 2006/120927 A1 | 11/2006 |
| WO | WO 2007/006577 A1 | 1/2007 |

OTHER PUBLICATIONS

Search Report and Written Opinion for International Application No. PCT/EP2008/009240 mailed Feb. 2, 2009.
English-Language Abstract for Japanese Patent Publication No. 02-245531 A, published Oct. 1, 1990; 1 page.

* cited by examiner

*Primary Examiner* — Peter B Kim
(74) *Attorney, Agent, or Firm* — Sterne, Kessler, Goldstein & Fox P.L.L.C.

(57) ABSTRACT

In a lithographic apparatus, dampers are provided that may be used within mounts for optical elements in order to damp the motion of the optical element relative to the component to which it is mounted.

13 Claims, 10 Drawing Sheets

LITHOGRAPHIC APPARATUS, PROJECTION SYSTEM AND DAMPER FOR USE IN A LITHOGRAPHIC APPARATUS AND DEVICE MANUFACTURING METHOD

CROSS REFERENCE TO RELATED APPLICATIONS

This application claims the benefit under 35 U.S.C. §119 (e) to U.S. Provisional Patent Application 60/988,341, filed Nov. 15, 2007, which is incorporated herein by reference in its entirety.

BACKGROUND

1. Field of the Invention

The present invention relates to a lithographic apparatus, a projection system and a damper for use in a lithographic apparatus and a method for manufacturing a device.

2. Background Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In general, there is a continual drive in the industry to provide lithographic apparatus capable of producing ever smaller pattern features. Consequently, there is a corresponding continual drive to improve the control of the lithographic process. In addition, as discussed above, it has been proposed to use a lithographic apparatus having a programmable patterning device. Such a lithographic device has improved flexibility because it is easier to change or adjust the pattern to be formed on a substrate. However, the use of a programmable patterning device may impose even more stringent requirements on the control of the lithographic process. For example, at least partly because of the constraints on the size of a programmable patterning device that can be formed, the area on a substrate that can be exposed at a given instant by a lithography apparatus using a programmable patterning device is significantly smaller than the corresponding area in a conventional lithographic apparatus. Consequently, in order to provide a lithographic apparatus having a sufficient throughput, each portion of a substrate may be exposed by a relatively small number of pulses of a pulsed radiation source compared to that of a conventional lithography apparatus. For example, whereas in a conventional lithography apparatus, each part of the substrate may be exposed by an exposure consisting of approximately 50 to 100 pulses of a pulsed radiation source, in a lithography apparatus using a programmable patterning device, it may be necessary to expose each portion of the substrate with only a few pulses of the pulsed radiation source and, possibly, only a single pulse. This results in a requirement for greater positional control of the optical elements in the projection system. Specifically, errors in the position of the optical elements within the projection system result in errors of the position of the pattern projected onto the substrate. Where a large number of pulses of radiation are used to expose a pattern, errors of the position of the optical element, for example caused by vibrations, are averaged out. Accordingly, vibration of the optical elements does not cause a shift of the image formed on the substrate, but merely slight blurring of the image. In contrast, if only a single pulse or a small number of pulses is used to form the pattern on the substrate, e.g., such as may be the case in a lithographic apparatus using a programmable patterning device, there are not sufficient number of pulses that slight positional errors are averaged out. Accordingly, errors in the position of the optical elements within the projection system result in displacement of the image formed on the substrate, e.g., overlay errors. Accordingly, it is necessary to improve the accuracy of the positioning of the optical elements within a projection system.

Previously, the accuracy of the positioning of the optical elements in a projection system has been improved by the provision of tuned-mass dampers or servos with accelerometer/geophone feedback which ensure that the optical elements remain substantially stationary even if the housing of the projection system is disturbed, for example if vibrations are transmitted into the projection system. However, such configurations may be relatively massive and/or may require too much space around the optical element. Furthermore, such arrangements may not provide sufficient accuracy of control of the patterned beam of radiation that is projected onto the substrate.

BRIEF SUMMARY

Therefore, what is needed is a system and method that may improve control of a beam of radiation projected onto a substrate.

In an embodiment, there is provided a projection system suitable for use in a lithography apparatus comprising a support frame, an optical element, and a mount, configured to mount the optical element to the support frame. The mount comprises at least one damper that is configured to provide damping to motion of the optical element relative to the support frame.

Additionally, or alternatively, there is a provided a lithographic apparatus, comprising a projection system as discussed above, and further comprising a substrate support configured to support a substrate and a substrate actuator system configured to control the position of the substrate support. The substrate actuator system is configured to control the position of the substrate support relative to the position of the support frame of the projection system.

In another embodiment there is provided a damper suitable for use in a lithographic apparatus. The damper comprises a first part, having a first cylindrical surface and a second part, having a second cylindrical surface. The first and second parts are configured such that at least a part of the second cylindrical surface surrounds at least a part of the first cylindrical surface. The damper further comprises a fluid provided between the first and second cylindrical surfaces and arranged such that it provides damping to motion of the first part relative to the second part.

In a still further embodiment there is provided a device manufacturing process, comprising the following steps. Projecting a patterned beam of radiation onto a substrate using a projection system that comprises a support frame and at least one optical element mounted to the support frame. Controlling the position of a substrate support, that is configured to support the substrate, relative to the position of the support frame of the projection system using an actuator system. Damping the motion of the at least one optical element relative to the support frame of the projection system using at least one damper.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form apart of the specification, illustrate one or more embodiments of the present invention and, together with the description, further serve to explain the principles of the invention and to enable a person skilled in the pertinent art to make and use the invention.

Figure 1:
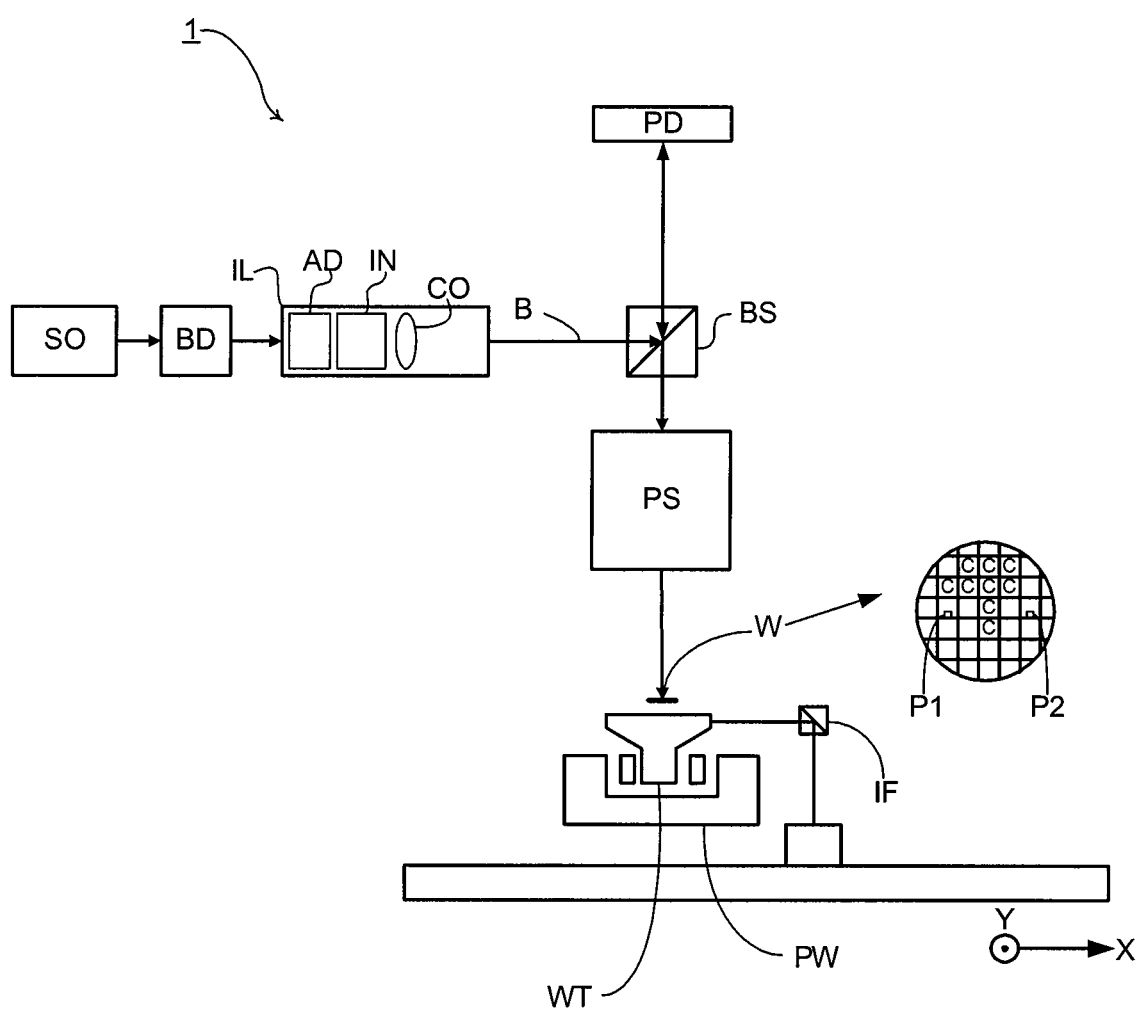
FIG. 1 depicts a lithographic apparatus.

FIGS. 8, 9, 10, 11, 12, 13, 14, and 15 depict various embodiments of a damper.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS.

However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
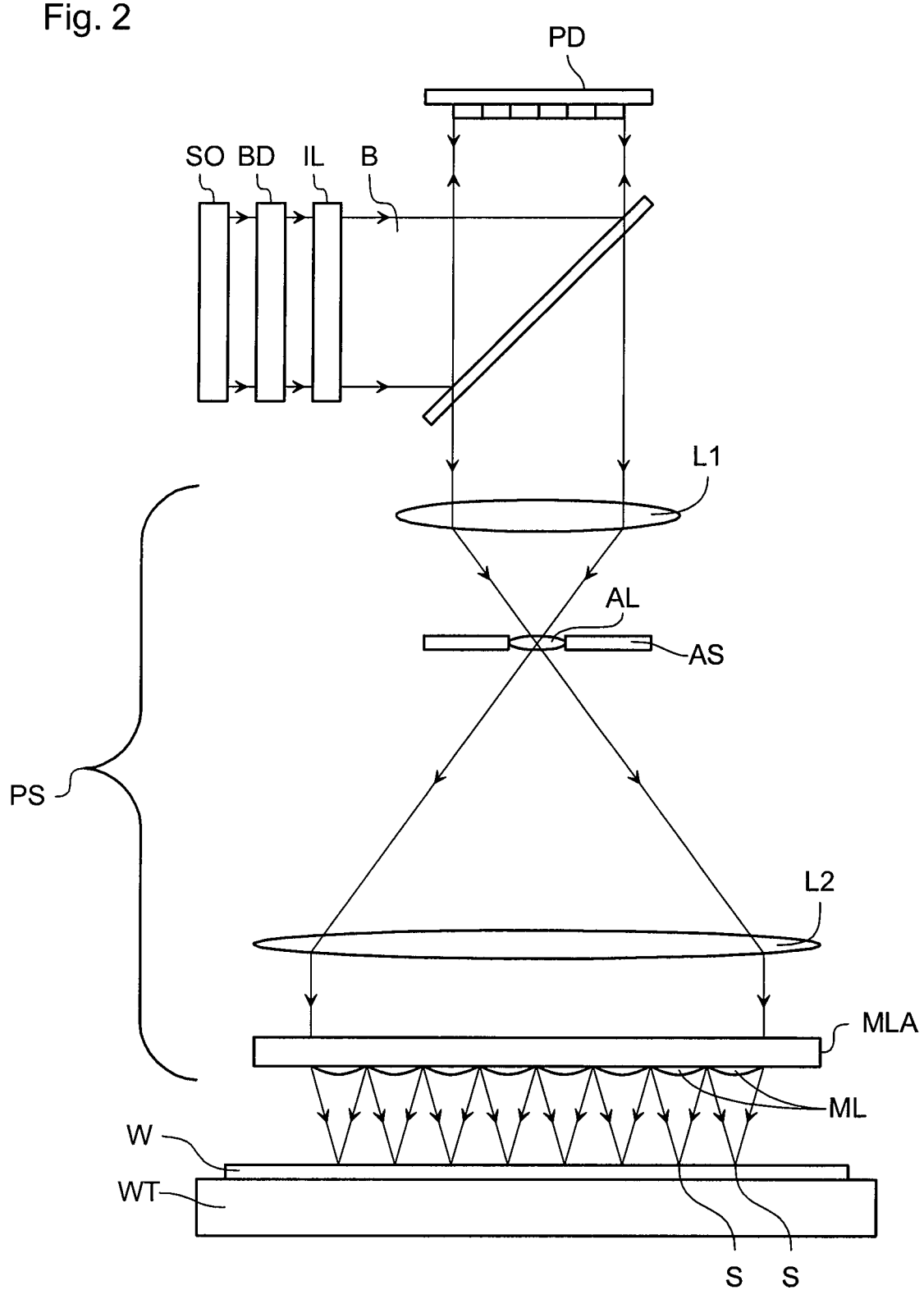
FIG. 2 depicts a lithographic apparatus.

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes abeam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
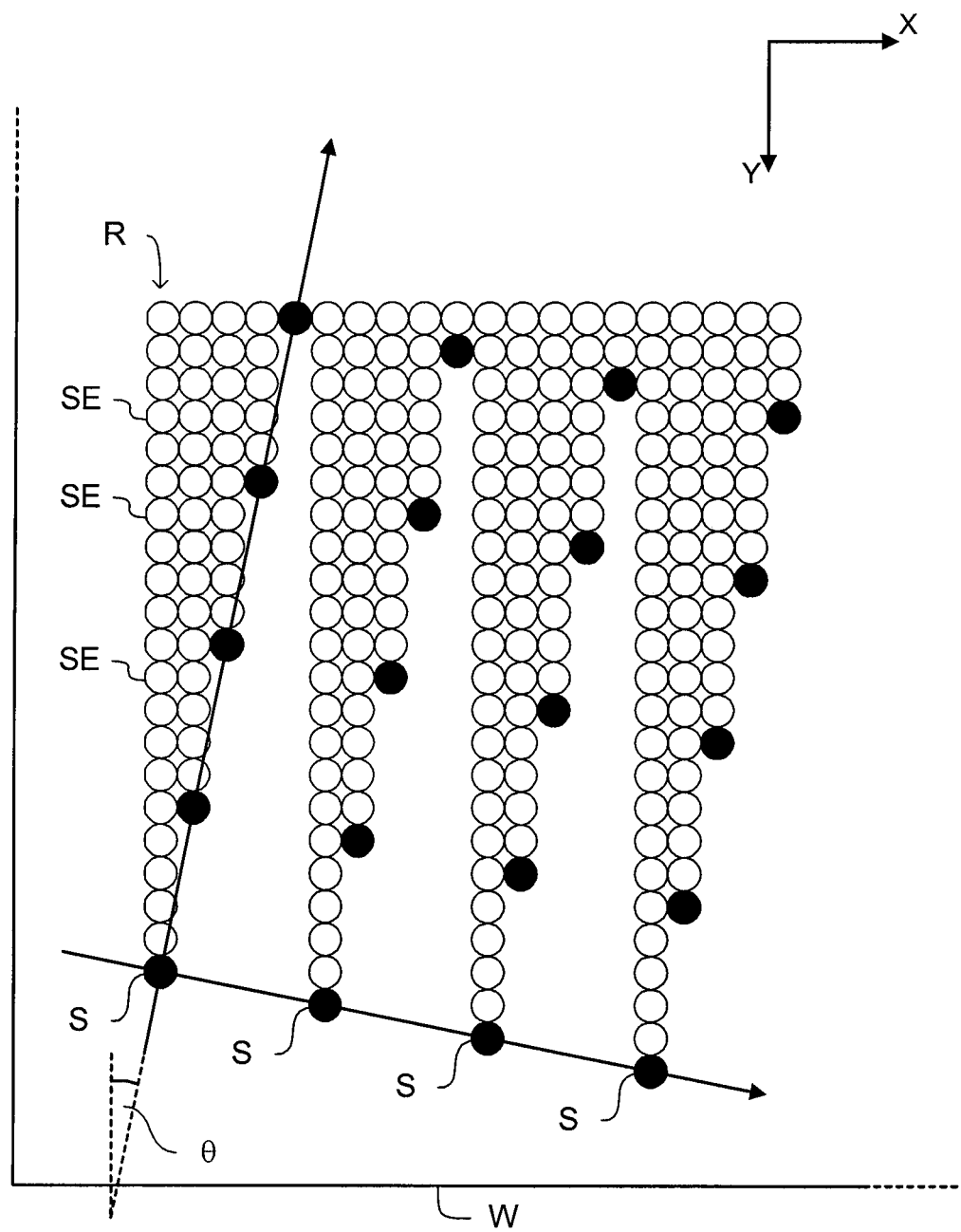
FIG. 3 depicts a mode of transferring a pattern to a substrate using the apparatus in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
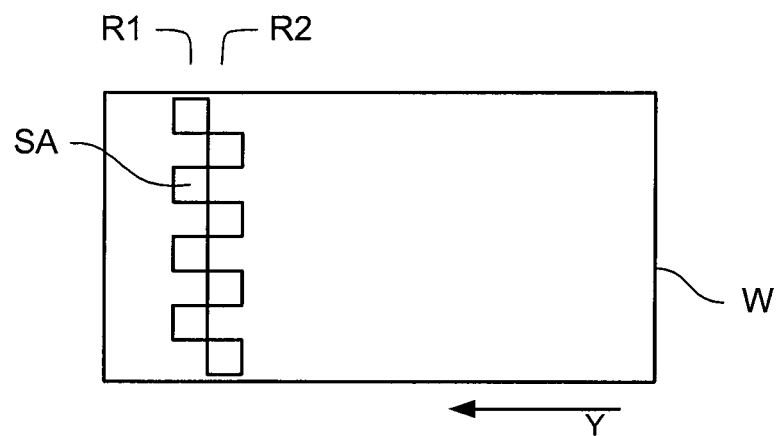
FIG. 4 depicts an arrangement of optical engines.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Embodiment 1

Figure 5:
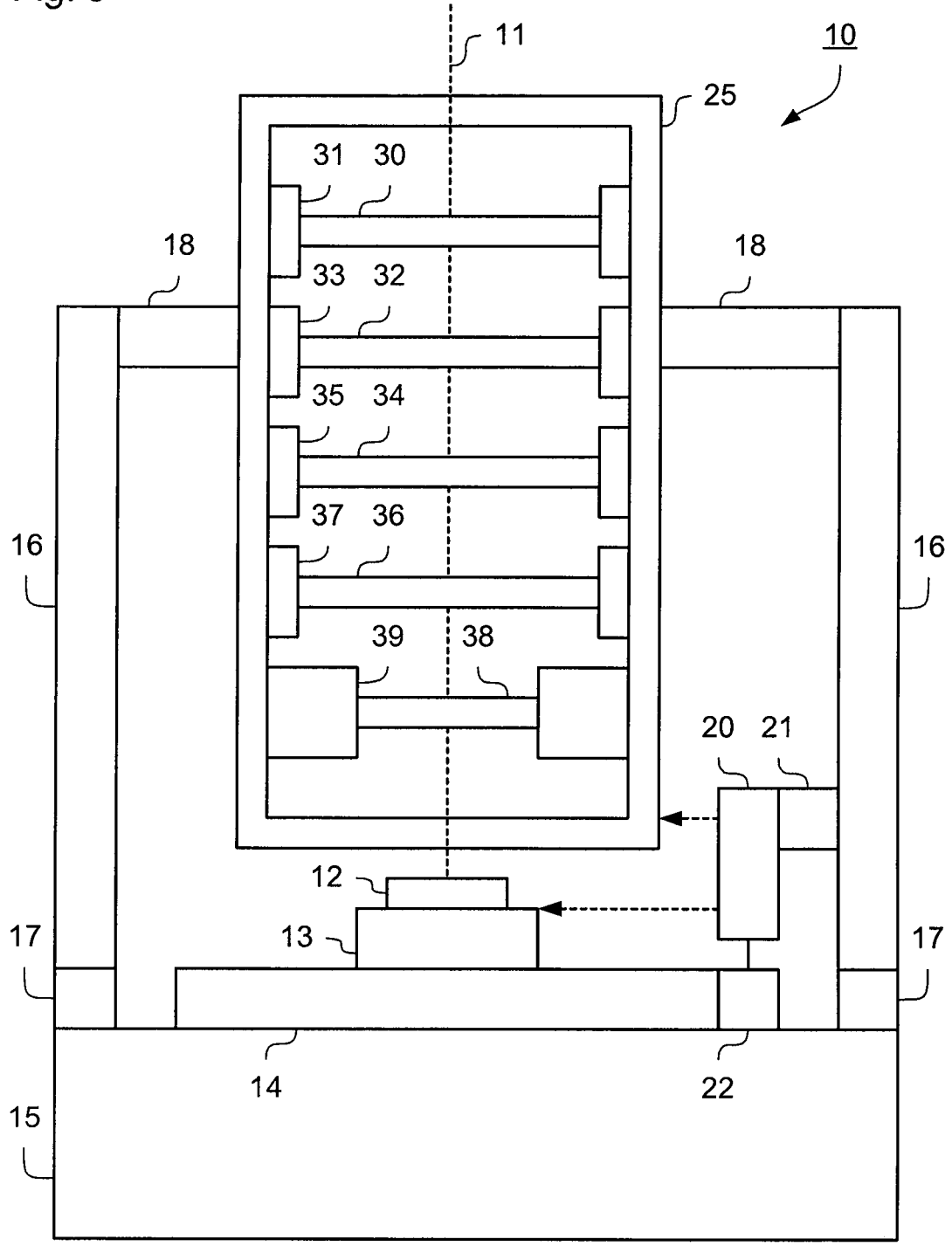
FIG. 5 depicts an arrangement of a projection system within a lithographic apparatus.

FIG. 5 depicts the arrangement of a projection system 10, configured to project a patterned beam of radiation 11 on to a substrate 12. The substrate 12 is mounted on a substrate support 13, which may be moved by a substrate actuator system 14 in order to adjust the position of the substrate 12. As shown, the lithographic apparatus may include a base frame 15 that supports the components of the lithographic apparatus and the substrate actuator system 14 may, in particular, be configured to provide a force between the base frame 15 and the substrate support 13, such that reaction forces generated by the substrate actuator system 14 do not create disturbances that affect other components within the lithographic apparatus.

In order to ensure that position-sensitive components of the lithographic apparatus are not disturbed by vibrations, either external to the lithographic apparatus or created, for example, by reaction forces exerted on the base frame 15 by the substrate actuator system 14, the lithographic apparatus may include a reference frame 16 mounted to the base frame 15 by dynamic isolators 17. For example, the dynamic isolators may be very low stiffness supports, such as air mounts, that minimize the transfer of any vibrations from the base frame 15 to the reference frame 16. Accordingly, position-sensitive components may be mounted, directly or indirectly, to the reference frame 16. For example, as shown in FIG. 5, the projection system 10 may be mounted to the reference frame 16 by supports 18. If required, the support 18 may also be low stiffness support to further minimize the transfer of any vibrations to the projection system 10 and/or the supports 18 may include an actuator system that may be used to adjust the position of the projection system 10.

The lithographic apparatus further includes a measurement system 20 that may measure the position of the substrate support 13 relative to the projection system 10. It should be appreciated that the measuring system 20 may measure the relative positions directly. Alternatively, the measuring system 20 may measure the displacement of the substrate support 13 relative to the projection system 10 and determine the position of the substrate support 13 relative to the projection system 10 from a known initial relative position and subsequent displacements.

As shown, the measuring system 20 may be mounted to the reference frame 16 by means of a mount 21. However, part or all of the measuring system may be mounted on one or both of the projection system 10 and the substrate support 13.

The substrate actuator system 14 may include a controller 22 that is configured to control the position of the substrate support 13 in response to the position of the substrate support 13 relative to the projection system 10 as determined by the measuring system 20. Consequently, the movement of the substrate support 13 may be controlled in a required manner relative to the projection system 10.

The substrate 12 may be positioned on the substrate support 13 in a manner such that the position of the substrate 12 is known relative to the substrate support 13. Alternatively or additionally, once the substrate 12 has been mounted to a substrate support 13, it may be inspected in order to determine more accurately the position of the substrate 12 relative to the substrate support 13. Accordingly, once the position of the substrate 12 relative to the substrate support 13 is known, control of the movement of the substrate support 13 relative to the projection system 10 provides accurate control of the substrate 12 relative to the projection system 10. This is beneficial because, provided the actuator system 14 and the measurement system 20 are sufficiently responsive, it is possible to compensate for positional errors of the projection system 10 relative to the remainder of the lithographic apparatus, such as those that may be caused by disturbances, enabling an improvement in the accuracy of the control of the patterned beam of radiation projected onto the substrate 12. For example, this may result in a reduction of overlay errors or focusing errors caused by movement of the projection system 10 relative to the substrate 12 in a direction parallel to the optical axis of the projection system.

With an arrangement according to the first embodiment, it ceases to be necessary, as in the previously considered projection systems, to minimize movement of the optical elements of the projection system relative to an inertial frame of reference. Accordingly, the use of tuned-mass dampers or servos with accelerometer/geophone feedback is no longer required. The removal of the former may result in a reduction of the mass of the projection system and the removal of the latter simplifies the projection system and, by removing the active components required for the latter, the requirement to dissipate heat is reduced.

However, in an arrangement according to the first embodiment, it is necessary to ensure that each of the optical elements 30,32,34,36,38 of the projection system 10 is in a fixed position relative to the remainder of the projection system. Accordingly, the projection system 10 is provided with a support frame 25 that is configured to have a very high stiffness. The projection system 10 is mounted to the reference frame 16 by means of the support frame 25. Furthermore, the measuring system 20 determines the position of the substrate support 13 relative to a portion of the support frame 25. The optical elements 30,32,34,36,38 of the projection system 10 are in turn mounted to the support frame 25 by means of respective mounts 31,33,35,37,39.

In one example, in order to ensure the optimal control of the projection of the patterned beam of radiation 11 onto the substrate 12, the optical elements 30,32,34,36,38 must be mounted in a manner to minimize their movement relative to the support frame 25. However, may not be possible simply to mount the optical elements 30,32,34,36,38 to the support frame 25 with fixed mounts of sufficient stiffness to prevent such movement. This is because there may be insufficient volume around the optical element 30,32,34,36,38 within the projection system 10 to provide mounts having the required stiffness. Furthermore, it may be necessary that the position of the optical elements 30,32,34,36,38 within the projection system 10 be adjustable in order to compensate for errors within the lithographic apparatus.

Therefore, one or more of the mounts 31,33,35,37,39 includes at least one damper that provides damping of the motion of the optical element relative to the support frame 25. By adding dynamic stiffness, which resists fast relative motion, such as that caused by vibrations, between the optical elements and the support frame 25, the amplitude of relative motion is reduced. Consequently, the control of the position of the optical elements 30,32,34,36,38 relative to the support frame 25 is improved and consequently, the control of the patterned beam of radiation 11 relative to the substrate 12 is improved.

Structures configured for very precise relative positioning of optical elements often exhibit very little vibration damping. Less than about 1% of critical damping, i.e., the level of damping required that is just sufficient to prevent free oscillations from arising, is often attained in critical vibration modes, e.g., the modes of vibration that have the greatest impact on the system. Higher damping of motion of the optical elements 30,32,34,36,38 relative to the support frame 25 may improve the matching of the motion of the optical elements to that of the frame. In particular, dynamic analysis has shown that above about 10% of critical damping, a good performance of the matching of the motion of the optical elements 30,32,34,36,38 with that of the support frame 25 of the projection system 10 is achieved. However, damping above about 30% of critical damping does not appear to further improve the dynamics significantly. Accordingly, it may be desirable that the damping be between approximately 10% and approximately 30% of critical damping.

It should be appreciated that, in a projection system, it may be sufficient to provide damping for only one or some of the optical elements, e.g., the more sensitive components. For other optical elements within the projection system 10 it may be sufficient merely to use high stiffness mounts. Furthermore, it should also be appreciated that it may be sufficient to provide damping of the sensitive components in the directions of motion to which the performance is most sensitive. It should also be appreciated that a single damper may be provided to damp the motion of an optical element. Alternatively, a system of two or more dampers may be provided for each optical element.

Embodiment 2

Figure 6A:
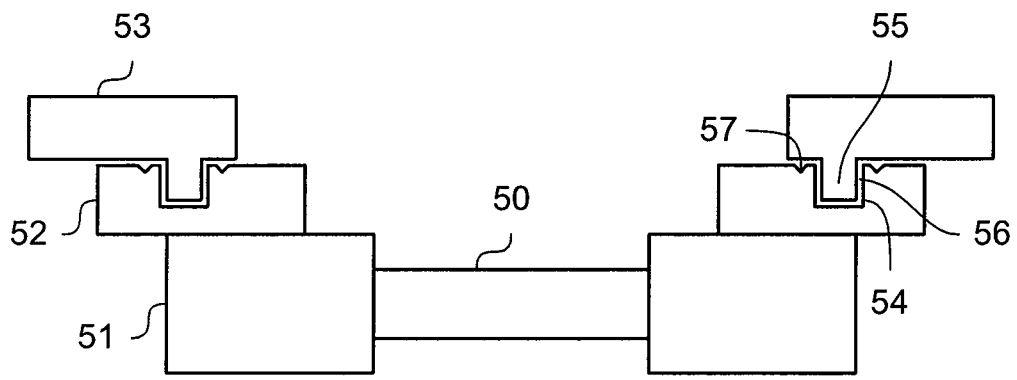
FIGS. 6a and 6b depict an arrangement of an optical element.
Figure 6B:
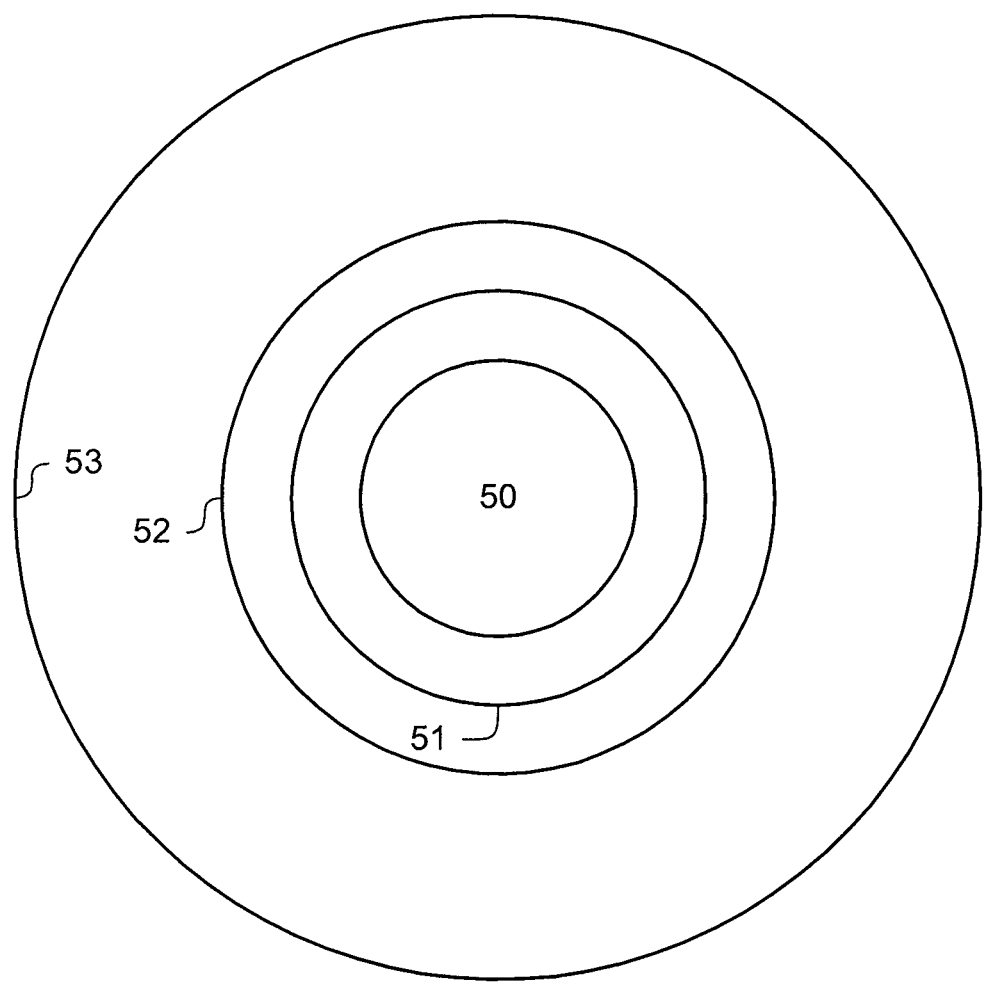

FIGS. 6a and 6b depict, respectively, a cross-section and a plan view of a mount for an optical element. Such a mount may be used in conjunction with the first embodiment discussed above.

As shown, the optical element 50 is held by and fixed to an inner mount 51 that supports the optical element 50. The inner mount 51 is connected to an outer mount, comprising a first damping ring 52 and a second damping ring 53. The outer mount may be connected to, for example, the support frame of a projection system by means of the second damping ring 53.

The first damping ring 52 includes an annular slot 54 configured to receive an annular projection 55 from the second damping ring 53. A small gap 56 is provided between the annular protrusion 55 of the second damping ring 53 and the annular slot 54 of the first damping ring. The gap 56 may be filled with a fluid, such as a viscous liquid. If the second damping ring 53 is to move relative to the first damping ring 52, the viscous liquid flows through the gap 56 and the resistance to this provides damping to the movement of the second damping ring 53 relative to the first damping ring 52. Such damping is frequently known as squeeze-film damping. By damping the movement of the second damping ring 53 relative to the first damping ring 52, the movement of the optical element 50 relative to the component to which it is to be mounted, for example the support frame of the projection system, is also damped.

In order to prevent egress of the damping fluid from the mount, the separation of the first damping ring 52 from the second damping ring 53 other than the gap 56 between the annular slot 54 of the first damping ring 52 and the annular projection 55 of the second damping ring 53 may be minimized. In addition, catch wells 57 may be provided on either side of the annular slot 54 on the first damping ring 52 that collect any damping fluid that does escape.

Although not depicted in FIGS. 6a and 6b, an actuator system may be provided in order to adjust the position of the optical element 50 relative to the second damping ring 53, e.g., relative to the component to which the optical element 50 is to be mounted.

It will be appreciated that the size of the damping gap 56 between the annular slot 54 of the first damping ring 52 and the annular projection 55 of the second damping ring 53 determines the attainable range of movement of the optical element 50. Furthermore, as the damping gap 56 increases, the damping decreases. However, the damping may be increased by using a fluid having higher viscosity. Accordingly, in order to increase the range of movement of the optical element, but provide sufficient damping, one may use a fluid with a higher viscosity. For example, with a gap 56 between the annular slot 54 of the first damping ring 52 and the annular projection 55 of the second damping ring 53 of approximately 100 μm and a dynamic viscosity of the fluid in the gap 56 of between about 0.5 and about 3 Ns/m$^2$, it is possible to provide damping of between about 10% and 30% of critical for a lens having a mass of up to approximately 10 kg.

When selecting the damping fluid to be used, it is desirable that the fluid is one which may be used within a lithographic apparatus. In particular, a liquid having ultra low vapor pressure and extremely high surface tension and which is degassed may be used to ensure that it does not release contaminants within the lithographic apparatus. Suitable materials include commercially available materials such as, but not limited to, SANTOVAC OS-138, KRYTOX 100 and KRYTOX 101. In general, other fluids such as polyphenyl ether fluids may be used. In general a fluid with a dynamic viscosity of between 0.5 Ns/m2 and 3 Ns/m2 may be desirable.

Embodiment 3

Figure 7:
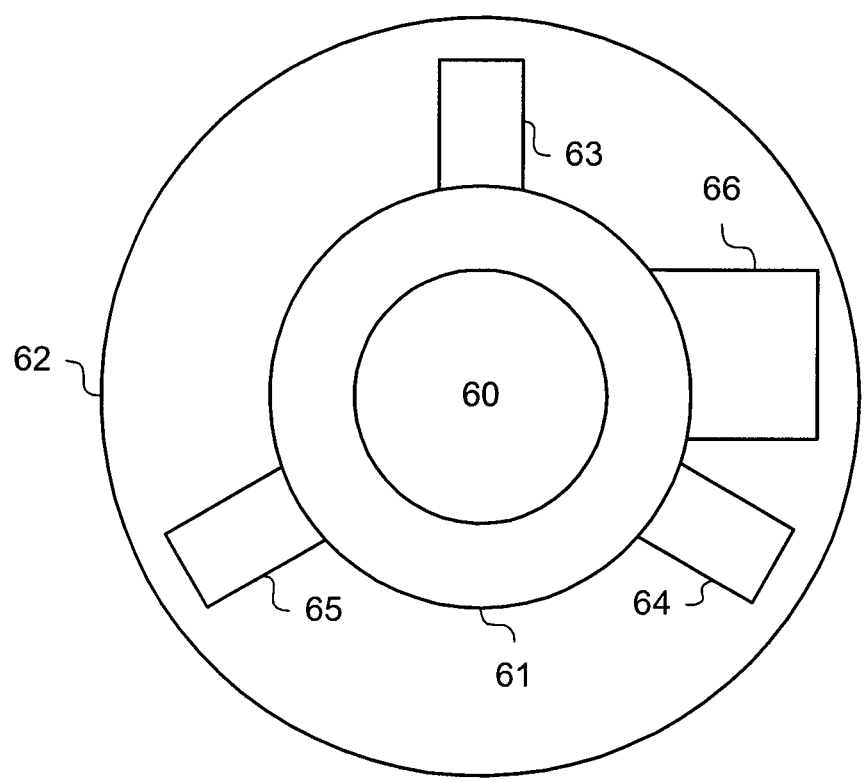
FIG. 7 depicts an alternative arrangement of an optical element.

FIG. 7 depicts an arrangement of a mount for an optical element according to a third embodiment. An arrangement according to the third embodiment may, for example, be used to mount an optical element within a projection system as discussed above in relation to the first embodiment.

As shown, the optical element 60 may be attached to and supported by an inner mount member 61. An outer mount member 62 may be disposed around the inner mount member 61 and configured to be connected to the component to which the optical element 60 is to be mounted, for example to the support frame of a projection system. As shown in FIG. 7, three dampers 63,64,65 are provided around the inner mount member 61 to provide damping of the movement of the inner mount member 61 relative to the outer mount member 62. In addition, although not shown in FIG. 7 for clarity, a set of flexures, e.g., elastic elements with tailored directional compliance may also be provided to connect the inner mount member 61 to the outer mount member 62.

It will be appreciated that, although as depicted in FIG. 7, the three dampers 63, 64, 65 may be evenly distributed around the optical element 60 this need not be the case. Furthermore, fewer dampers or a greater number of dampers may be provided. However, the arrangement depicted in FIG. 7 may be beneficial because each of the dampers may be configured to primarily provide damping to motion in a given direction. Accordingly, by evenly distributing three dampers around the optical element 60 such that their directions of primary damping are arranged at different orientations, preferably separated from each other by approximately 120o, efficient and even damping of a range of motions of the optical element 60 may be provided.

As shown, an actuator system 66 may be provided that enables control of the position of the inner mount 61, and hence the optical elements 60 relative to the outer mount 62 and hence the component to which the optical element 60 is to be mounted. It will be appreciated that the actuator system 66 may be comprised of a plurality of actuators. Although it is depicted in FIG. 7 as being a single unit, it should be appreciated that the actuator system may be distributed about the optical element 60. The actuators within the actuator system may be any convenient form of actuator, for example piezoelectric actuators or voice coil actuators.

Figure 8:
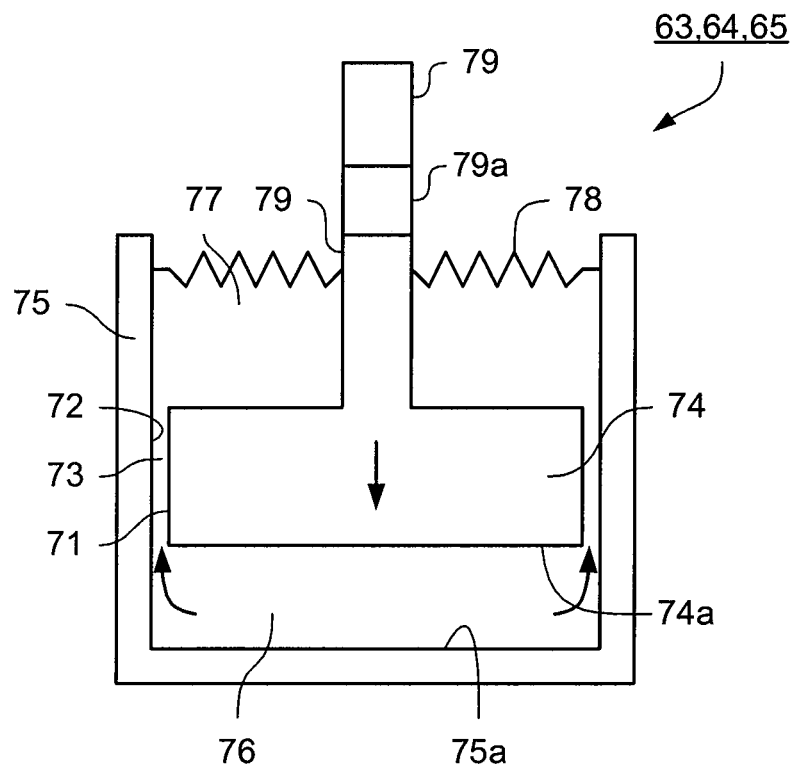

FIG. 8 depicts in cross-section an example of a damper 63,64,65 according to the third embodiment. The damper 63,64,65 has a first cylindrical surface 71 surrounded by a second cylindrical surface 72 with an annular gap 73 between. The first cylindrical surface 71 may be provided by a piston 74 and the second cylindrical surface 72 may be provided by a cylinder 75. A fluid, for example a viscous liquid as discussed above in relation to the second embodiment, is provided in the gap 73 and therefore provides a resistance to movement of the first cylindrical surface 71, e.g., the piston 74 relative to the second cylindrical surface 72, e.g., the cylinder 75.

The performance of the damper may be improved by enclosing one end of the cylinder 75 with an end face 75a. This, in conjunction with an end face 74a of the piston 74 creates a chamber 76. As the piston 74 moves, the volume of the chamber 76 changes, forcing the fluid through the annular gap 73 between the first cylindrical surface 71 and the second cylindrical surface 72. For example, as depicted by the arrows in FIG. 8, as the piston 74 is moved towards the chamber 76, the fluid is squeezed between the first cylindrical surface 71 and the second cylindrical surface 72 towards a second chamber 77 on the opposite side of the piston 74 from the first chamber 76. The requirement for the fluid to squeeze through the annular gap 73, rather than the fluid merely resisting the relative motion of the first cylindrical surface 71 and the second cylindrical surface 72, increases the damping of the damper. It will be appreciated that the reverse motion reverses the flow of the damping fluid through the annular gap 73, also providing resistance to the motion.

As shown, a diaphragm 78 may be provided to contain the fluid within the second chamber 77. As depicted in FIG. 8, the diaphragm 78 may have a corrugated shape. However, it may also be a flat surface. The diaphragm 78 is provided between a rod 79 connected to the piston 74 and the second cylindrical surface 72. The diaphragm 78 also provides a function of restricting the movement of the rod 79 in a largely axial direction, e.g., parallel to the central axis of the first and second cylindrical surfaces 71,72. This restriction of movement enables the use of a relatively small annular gap 73, increasing the level of damping attainable for a given size of damper. It will also be appreciated that the primary direction of damping of the damper depicted in FIG. 8 is in the axial direction. However, it should be appreciated that some movement in other directions is permitted and that the damper will also provide damping to movements in those directions.

A feature of the annular shape of the gap 73 between the first and second cylindrical surfaces 71,72 is that the damping provided by the damper is largely unaffected by the position of the piston 74 relative to the cylinder 75 for a given range of movement of the piston relative to the cylinder. Accordingly the damper may be used in conjunction with optical elements configured to have an adjustable position.

The rod 79 connected to the piston 74 may include a flexure member 79A that permits the free end of the rod 79 to bend relative to the piston 74. This may permit a greater range of motion of the free end of the rod 79 relative to the cylinder 75 without significantly affecting the level of damping. It may also be configured to allow lateral motion of the two components connected by the damper, e.g., in a direction perpendicular to the central axis of the cylindrical surfaces 71,72. It will be appreciated that the cylinder 75 may be connected to the outer mount member 62 and the free end of the rod 79 may be connected to the inner mount member 61 in order to provide a damping force against movement of the inner mount member 61 (and hence the optical element 60) relative to the outer mount member 62 (and hence the component to which the optical element 60 is to be mounted). It should be appreciated, however, that these connections may be reversed.

In an example, a damper as above may be configured such that the annular gap 73 has a thickness of between approximately 50 μm and 350 μm and may include a damping liquid as discussed above in relation to the second embodiment. Such a damper may provide a damping coefficient of approximately 5,000 Ns/m to approximately 10,000 Ns/m. Used in an arrangement as depicted in FIG. 7, such dampers may provide the desired 10% to 30% of critical damping, or even higher, potentially approaching 100% of critical damping, of an optical element having a mass of approximately 10 kg as discussed above.

It should be appreciated that the distance between the surfaces 74a,75a that define the chamber 76 must be sufficient to accommodate the axial motion of the piston 74 relative to the cylinder 75. However, this distance may be relatively small, in particular significantly smaller than the schematic representation shown in FIG. 8 (in which the distance is relatively large for clarity). Accordingly, the distance may be small enough that viscous dissipation occurs due to motion of the fluid relative to the surfaces 74a,75a. Accordingly, additional damping beyond that caused by viscous dissipation in the gap 73, may be provided.

Embodiment 4

Figure 9:
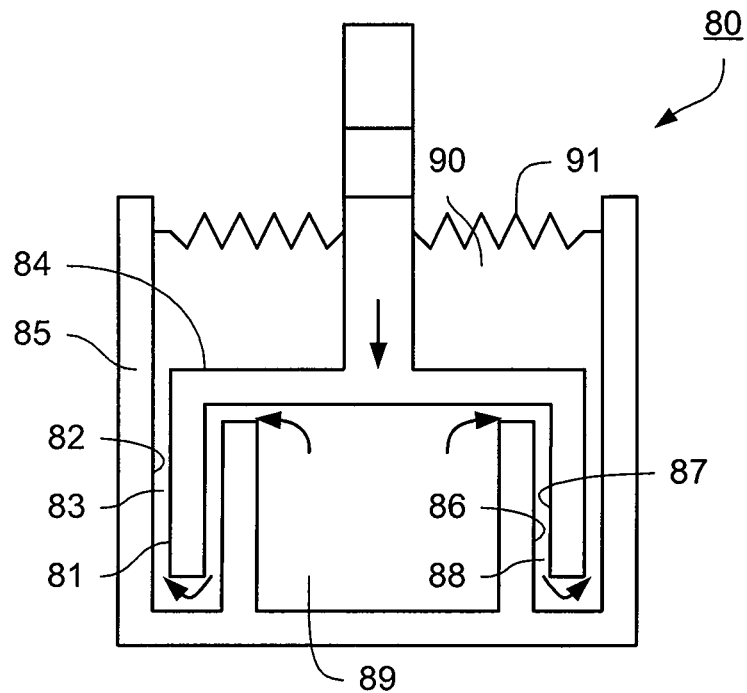

The fourth embodiment corresponds to the third embodiment, but uses a different arrangement of damper. A cross-section of a damper according to the fourth embodiment is depicted in FIG. 9. In the fourth embodiment a damper as depicted in FIG. 9 may be used in place of the damper depicted in FIG. 8 discussed above in relation to the third embodiment. Variations of the damper discussed above in relation to the third embodiment apply also to the damper of the fourth embodiment.

As with the third embodiment, the damper 80 of the fourth embodiment includes a first cylindrical surface 81 formed on a piston 84, a second cylindrical surface 82 formed on a cylinder 85 and an annular gap 83 between the first and second cylindrical surfaces 81,82.

However, the cylinder 85 further includes a third cylindrical surface 86 surrounded by a fourth cylindrical surface 87 formed on the piston 84. A second annular gap 88 is provided between the third and fourth surfaces 86,87.

As with the third embodiment, the piston 84 and the cylinder 85 define a first chamber 89 that changes in volume as the piston 84 moves relative to the cylinder 85. For example, as depicted in the arrows in FIG. 9, as the piston 84 advances into the cylinder 85, the first chamber 89 becomes smaller, squeezing the damping fluid provided within the damper 80 from the chamber 89 through the annular gap 88 between the third and fourth cylindrical surfaces 86,87 and through the annular gap 83 between the first and the second cylindrical surfaces 81,82. As with the damper of the third embodiment, the damper 80 of the fourth embodiment includes a second chamber 90 bounded by a diaphragm 91 into which the damping fluid is forced. It will be appreciated that, when the movement is reversed, e.g., when the piston 84 is withdrawn from the cylinder 85, the damping fluid is forced through the annular gap 83 between the first and the second cylindrical surfaces 81,82 and through the annular gap 88 between the third and fourth cylindrical surface 86,87 into the first chamber 89.

Accordingly, the damper 80 of the fourth embodiment provides two annular gaps 83,88 through which the damping fluid is forced, and may approximately double the shear film area providing more damping than the arrangement of the third embodiment for a total given size of the damper and a given size of annular gap (and hence range of movement). This is beneficial because the available volume within a lithographic apparatus, and in particular within a projection system within a lithographic apparatus, is limited.

Embodiment 5

Figure 10:
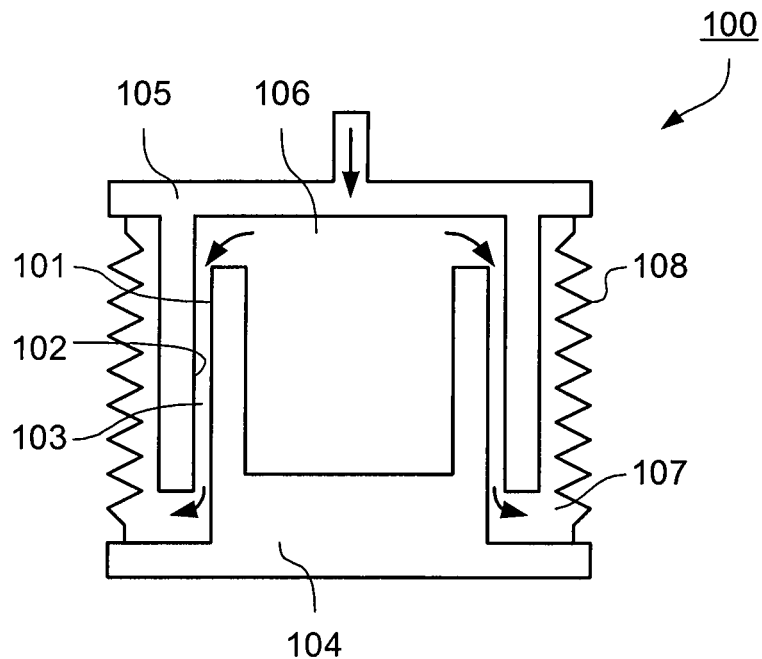

As depicted in cross-section in FIG. 10, the fifth embodiment provides a further alternative damper 100 that may be used in place of the damper depicted in FIG. 8 in the third embodiment. Variations of the damper discussed above in relation to the third embodiment apply also to the damper 100 of the fifth embodiment.

As with the third embodiment, the damper 100 of the fifth embodiment includes a first cylindrical surface 101 on a first part 104 of the damper 100 and a second cylindrical surface 102 formed on a second part 105 of the damper 100, providing an annular gap 103 between the first and second cylindrical surfaces 101,102.

A chamber 106 is provided that is defined by the first and second parts 104,105 and changes in volume as the parts move relative to each other. For example, as depicted by the arrows in FIG. 10, as the first and second parts 104,105 move towards each other, the first chamber 106 decreases in volume, forcing a damping fluid provided within the damper 100 to squeeze through the annular gap 103, providing a damping resistance to the movement. The damping fluid squeezed through the annular gap 103 is forced into an outer chamber 107, which is bounded by a resilient barrier 108. The resilient barrier 108 may, for example, be formed from bellows, as depicted in FIG. 10. However, other resilient barriers may be used, provided they retain the damping fluid within the second chamber 107 and permit the first and second parts 104, 105 of the damper 100 to move relative to each other.

The damper 100 of the fifth embodiment compared to the damper of the third and fourth embodiments permits greater movement of the first and second parts relative to each other. This may be beneficial if the damper is to be used within a mount for an optical element within a projection system in which it is desirable to adjust the position of the optical element relative to the support frame of the projection system, such as discussed above. The overall size of the damper may be similar to that of the third embodiment and the annular gap may also be between approximately 5 µm and 350 µm.

Embodiment 6

Figure 11:
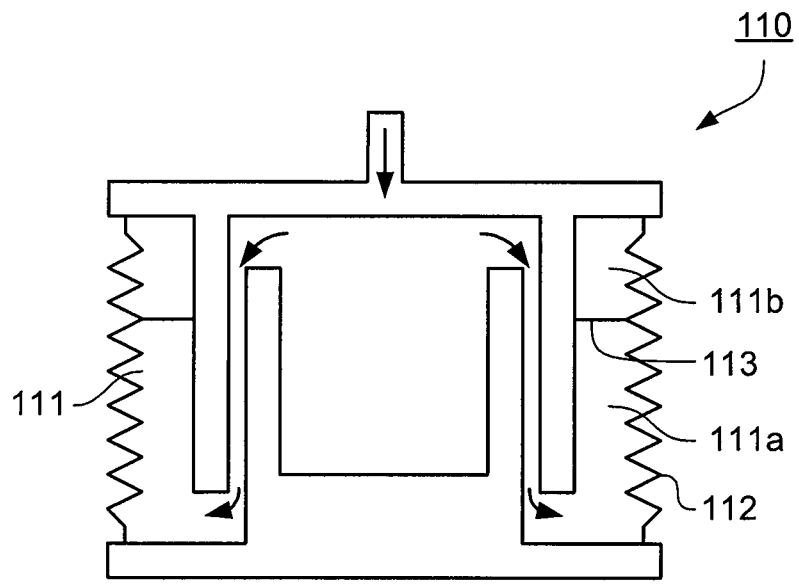

FIG. 11 depicts in cross-section a damper 110 according to the sixth embodiment of the present invention. The damper 110 largely corresponds to the damper 100 of the fifth embodiment and, for brevity, the differences thereof will be discussed.

In particular, as shown, the second chamber 111, bounded by the resilient barrier 112, is divided into a first portion 111a and a second portion 111b by a diaphragm 113. The first portion 111a of the second chamber 111 performs the same function as the second chamber 107 of the damper 100 of the fifth embodiment, e.g., contains the damper fluid, for example a viscous liquid. The second portion 111b of the second chamber 111 contains a compressible gas. Accordingly, as the damper fluid is forced through the annular gap into the second chamber 111, the gas in the second part 111b of the second chamber 111 is compressed, avoiding or reducing any bulging that may occur to the resilient barrier 112.

In a variation of the sixth embodiment, the diaphragm 113 may be omitted but the compressible gas may be retained within part of the second chamber 111 and perform the same function.

Although the second portion 111b of the second chamber is depicted in FIG. 11 as being disposed at one end of the second chamber this need not be the case. It will be appreciated that it may be arranged in any convenient portion of the second chamber.

Embodiment 7

Figure 12:
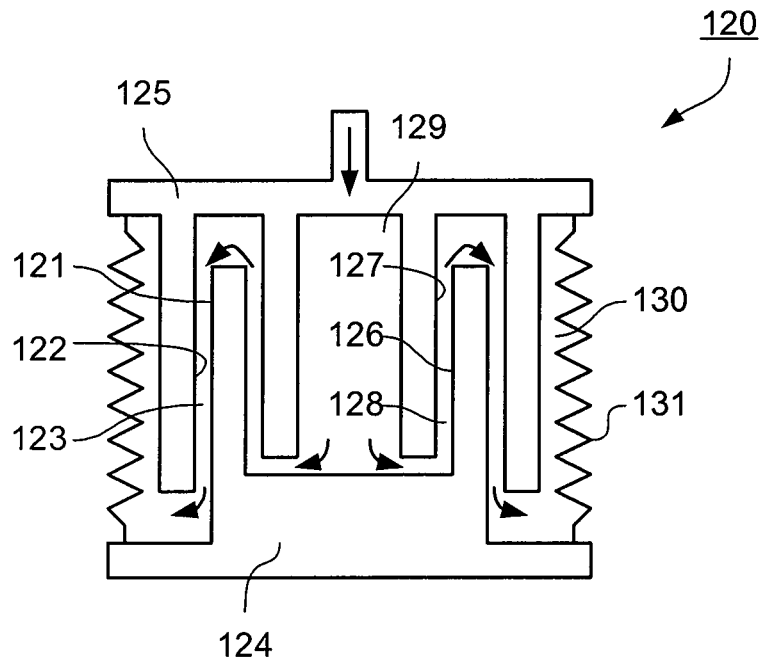

FIG. 12 depicts in cross-section a damper 120 according to the seventh embodiment that may be used in place of the damper of the third embodiment. Variations of the damper discussed above in relation to the third embodiment also apply to the damper 120 of the seventh embodiment.

As shown, the damper of the seventh embodiment includes a first cylindrical surface 121 provided on a first part 124 and a second cylindrical surface 122 provided on a second part 125. An annular gap 123 is defined between the first and second cylindrical surfaces 121,122. In addition, the first part includes a third cylindrical surface 126 and the second part has a fourth cylindrical surface 127 and a second annular gap 128 is defined between the third and fourth cylindrical surfaces 126,127.

As with the third embodiment, the first and second parts 124,125 define a first chamber 129 that contains the damping fluid. As the first and second parts 124,125 of the damper 120 move relative to each other, the volume of the chamber 129 changes. For example, as depicted by the arrows in FIG. 12, as the first and second parts 124,125 of the damper 120 move towards each other, the volume of the chamber 129 decreases, forcing damping fluid through the annular gap 128 between the third and fourth cylindrical surfaces 126,127 and through the annular gap 123 between the first and second cylindrical surfaces 121,122. Likewise, when the first and second parts 124,125 of the damper 120 move apart, the damping fluid is forced through the annular gap 123 between the first and second cylindrical surfaces and the annular gap 128 between the third and fourth cylindrical surfaces 126,127 into the first chamber 129. Damping fluid forced from the first chamber 129 through the annular gaps 128,121 is forced into a second chamber 130 which in a manner corresponding to the fifth embodiment is bounded by a resilient barrier 131.

As will be apparent, the difference between the seventh embodiment and the fifth embodiment is the provision of a second annular space through which the damping fluid must be forced. Accordingly, the shear film area is increased and greater damping is provided by the seventh embodiment and by the fifth embodiment for a given size of damper and a given size of annular gap (and hence range of movement).

Embodiment 8

Figure 13:
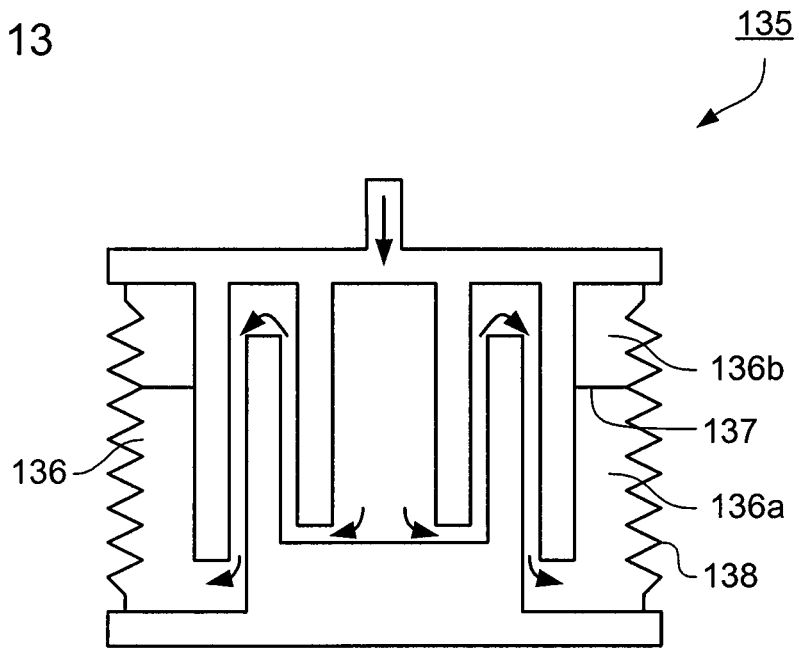

FIG. 13 depicts, in cross-section, a damper 135 according to the eighth embodiment. The damper 135 of the eighth embodiment corresponds to the damper 120 of the seventh embodiment but, in a manner corresponding to the damper 110 of the sixth embodiment, the second chamber 136 is divided by a diaphragm 137 into a first part 136a containing the damper fluid and a second part 136b containing a compressible gas. The provision of the compressible gas permits the flow of the damping fluid into and out of the second chamber 136 without bulging of the resilient barrier 138 that bounds the second chamber 136. As with the sixth embodiment, the diaphragm 137 may be omitted.

Embodiment 9

Figure 14:
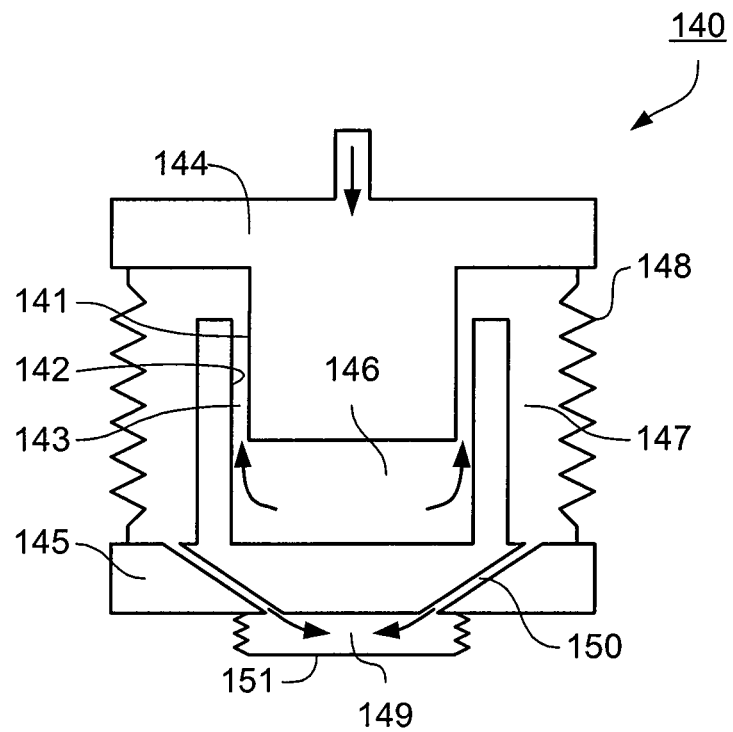

FIG. 14 depicts, in cross-section, a damper 140 according to the ninth embodiment that may be used in place of the damper discussed above in the third embodiment. Variations discussed above in relation to the third embodiment apply also to the ninth embodiment.

As shown, the damper 140 of the ninth embodiment includes a first cylindrical surface 141 formed on a first part 144 of the damper 140 and a second cylindrical surface 142 formed on a second part 145 of the damper 140, defining an annular gap 143 between the first and second cylindrical surfaces 141,142.

A first chamber 146 is defined by the first and second parts 144,145 of the damper 140. As with previous embodiments, the volume of the first chamber 146 changes as the first and second parts 144,145 of the damper 140 move relative to each other. Accordingly, for example as depicted by the arrows in FIG. 14, as the first and second parts 144,145 of the damper 140 move closer to each other, the first chamber 146 decreases in volume and the damping fluid contained within the first chamber 146 is forced through the annular gap 143 between the first and second cylindrical surfaces 141,142. The damping fluid is consequently forced into a second chamber 147 that is bounded by a resilient barrier 148 in a manner corresponding to the fifth embodiment discussed above.

The damper 140 of the ninth embodiment further includes a third chamber 149 in fluid connection with the second chamber 147 by means of one or more fluid passages 150. The third chamber 149 is defined by a second resilient barrier 151 and is configured such that the volume of the third chamber 149 may change, depending on the amount of the damping fluid forced into the third chamber 149. For example, as the damping fluid is forced from the first chamber 146 through the annular gap 143 into the second chamber 147 and successively into the third chamber 149, the second resilient barrier 151 may deform such that the volume of the third chamber 149 increases. Consequently, the resilient barrier 148 defining the second chamber 147 may be arranged to permit relative movement of the first and second parts 144,145 of the damper 140, but bulging of the resilient barrier 148 is prevented or at least minimized.

The overall size of the damper may be similar to that of the third embodiment and the annular gap may also be between approximately 50 μm and 350 μm.

Although FIG. 14 and the above description of the damper 140 according to the ninth embodiment requires distinct second and third chambers 147,149 separated by one or more fluid passages 150, it should be appreciated that this may not be the case. In particular, the second chamber 147 could be configured to merely form a fluid passage connecting the annular gap 143 to the third chamber 149.

Embodiment 10

Figure 15:
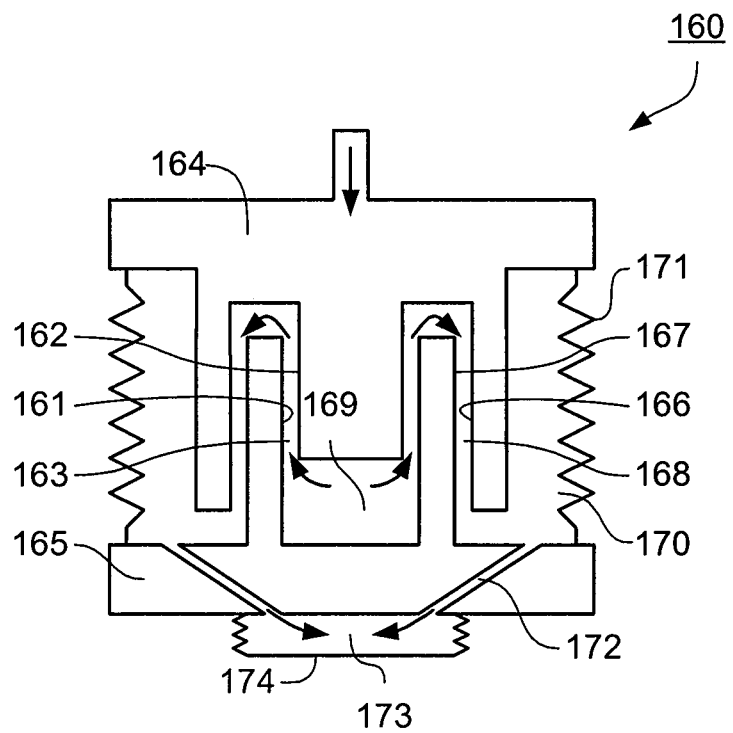

FIG. 15 depicts, in cross-section, a damper 160 according to the tenth embodiment. The damper 160 of the tenth embodiment corresponds to the damper 140 of the ninth embodiment and, for brevity, description of like parts will not be repeated.

The primary difference between the damper 160 of the tenth embodiment and the damper 140 of the ninth embodiment is the provision of two annular gaps. Accordingly, the first and second parts 164,165 of the damper 160 have first and second cylindrical surfaces 161,162, respectively, defining an annular gap 163. In addition, the first and second parts 164,165 of the damper 160 have third and fourth cylindrical surfaces 166,167, respectively, defining a second annular gap 168.

As with other embodiments, a first chamber 169 is defined by the first and second parts 164,165 such that the volume of the first chamber 169 changes as the first and second parts 164,165 of the damper 160 move relative to each other. For example, as depicted by the arrows shown in FIG. 15, as the first and second parts 164,165 of the damper 160 move towards each other, the volume of the first chamber 169 decreases and the damping fluid within the first chamber 169 is forced through the first annular gap 163 and the second annular gap 168 into a second chamber 170 bounded by a resilient barrier 171. From the second chamber 170, the damping fluid is forced through one or more fluid conduits 172 into a third chamber 173 formed by a resilient barrier 174 that permits the volume of the third chamber 173 to change in order to accommodate the damping fluid flowing into and out of the third chamber 173 as the first and second parts 164,165 of the damper 160 move relative to each other. As with previous embodiments, it will be appreciated that the damper 160 of the tenth embodiment has a greater shear film area and therefore provides a greater damping force than the damper 140 of the ninth embodiment for a given size of damper and given size of annular gap (and hence range of movement).

It will be appreciated that the movements damped by the dampers will be very small. However it has been found that the damping effect of the dampers according to the embodiments described above persists for sub-nanometer displacement amplitudes.

It will be appreciated that, if desired, a mount for an optical element may comprise dampers according to two or more of the third to tenth embodiments.

Beneficially, dampers arranged as described above may also be sufficiently compact to fit within the space available for present arrangements of mounts for optical elements. Accordingly significant re-design of projection systems to permit the use of such dampers may not be required.

It will further be appreciated that, although the above description has described dampers for use in mounts used to mount optical elements within a projection system in a lithographic apparatus, the dampers may also be used within the mounts of other optical elements within a lithographic apparatus. It will also be appreciated that the optical elements may be of any kind used within a lithographic apparatus including, for example, refractive and reflective optical elements.

If required, the dampers may be surrounded by a leak containment shield. Such an arrangement may be beneficial to reduce the risk of any damping fluid leaking into the remainder of the projection system, for example if a damper leaks.

Although specific reference may be made in this text to the use of lithographic apparatus in the manufacture of a specific device (e.g., an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

The invention claimed is:

1. A projection system, comprising:
a support frame;
an optical element; and
a mount configured to mount the optical element to the support frame,
wherein the mount comprises at least one damper, comprising a piston, configured to provide damping to motion of the optical element relative to the support frame, the at least one damper further comprising:
a rod connected to the piston, the rod including a flexure member,
first and second chambers connected by a space bounded by first and second surfaces, and
a fluid which is constrained such that movement of the optical element relative to the support frame causes the fluid to flow from the first chamber to the second chamber providing damping to the motion.

2. The projection system of claim 1, wherein the damper provides a damping force between the optical element and the support frame.

3. The projection system of claim 1, wherein the mount comprises at least three of the dampers that are arranged around the optical element.

4. The projection system of claim 3, wherein:
each of the dampers is configured such that it provides maximum damping to motion in a primary damping direction; and
the dampers are arranged such that the primary damping direction of each is different from the primary damping direction of the other dampers.

5. The projection system of claim 1, wherein the projection system further comprises:
a plurality of optical elements, each mounted to the support frame by a corresponding mount having at least one of the damper configured to provide damping to motion of the optical element relative to the support frame.

6. The projection system of claim 1, wherein the mount further comprises:
an actuator system configured to adjust the position of the optical element relative to the support frame.

7. The projection system of claim 1, wherein the mount comprises:
an inner support that is connected to the optical element; and
an outer support that is connected to the support frame,
wherein the at least one damper is connected between the inner support and the outer support.

8. The projection system of claim 7, wherein an actuator system is configured to adjust the position of the inner support relative to the outer support.

9. The projection system of claim 1, wherein the motion of the optical element relative to the support frame is damped to between approximately 10% and approximately 30% of critical damping.

10. A lithographic apparatus, comprising:
a projection system, comprising,
a support frame,
an optical element, and
a mount configured to mount the optical element to the support frame,
wherein the mount comprises at least one damper, comprising a piston, configured to provide damping to motion of the optical element relative to the support frame, and the at least one damper further comprising:
a rod connected to the piston, the rod including a flexure member,
first and second chambers connected by a space bounded by first and second surfaces, and
a fluid which is constrained such that movement of the optical element relative to the support frame causes the fluid to flow from the first chamber to the second chamber providing damping to the motion;
a substrate support configured to support a substrate; and
a substrate actuator system configured to control the position of the substrate support,
wherein the substrate actuator system is configured to control the position of the substrate support relative to the position of the support frame of the projection system.

11. The lithographic apparatus of claim 10, further comprising:
a measuring system that is configured to measure at least one of the position and a displacement of the substrate support relative to the support frame of the projection system; and
a controller that is configured to control the substrate actuator system in response to the measurements of the measuring system.

12. The lithographic apparatus of claim 10, further comprising:
a base frame to which components of the lithography apparatus are coupled; and
a metrology frame that is coupled to the base frame, such that the metrology frame is substantially dynamically isolated from the base frame;
wherein the support frame of the projection system is coupled to the metrology frame, and
wherein the substrate actuator system is configured to control the position of the substrate support by the provision of force between the substrate support and the base frame.

13. A device manufacturing process, composing:
projecting a patterned beam of radiation onto a substrate using a projection system that comprises a support frame and at least one optical element mourned to the support frame;
controlling the position of a substrate support, which is configured to support the substrate, relative to the position of the support frame of the projection system using an actuator system; and
damping motion of the at least one optical element relative to the support frame of the projection system using at least one damper comprising:
a piston,
a rod connected to the piston, the rod including a flexure member,
first and second chambers connected by a space bounded by first and second surfaces, and
a fluid which is constrained such that movement of the optical element relative to the support frame causes the fluid to flow from the first chamber to the second chamber providing damping to the motion.

* * * * *

UNITED STATES PATENT AND TRADEMARK OFFICE
CERTIFICATE OF CORRECTION

PATENT NO.       : 8,625,070 B2
APPLICATION NO.  : 12/258689
DATED            : January 7, 2014
INVENTOR(S)      : Farnsworth et al.

Page 1 of 1

It is certified that error appears in the above-identified patent and that said Letters Patent is hereby corrected as shown below:

In the Claims

In claim 13, col. 24, line 40, please delete "composing" and replace with "comprising"

In claim 13, col. 24, line 43, please delete "mourned" and replace with "mounted"

Signed and Sealed this
Twenty-seventh Day of May, 2014

Michelle K. Lee
*Deputy Director of the United States Patent and Trademark Office*